United States Patent [19]

Nishizawa et al.

[11] Patent Number: 5,338,389
[45] Date of Patent: Aug. 16, 1994

[54] METHOD OF EPITAXIALLY GROWING COMPOUND CRYSTAL AND DOPING METHOD THEREIN

[75] Inventors: Jun-ichi Nishizawa; Toru Kurabayashi, both of Miyagi, Japan

[73] Assignee: Research Development Corporation of Japan, Tokyo, Japan

[21] Appl. No.: 49,661

[22] Filed: Apr. 21, 1993

Related U.S. Application Data

[63] Continuation of Ser. No. 860,253, Mar. 31, 1992, abandoned, which is a continuation of Ser. No. 642,965, Jan. 18, 1991, abandoned.

[30] Foreign Application Priority Data

Jan. 19, 1990 [JP] Japan ................... 2-8399

[51] Int. Cl.$^5$ ............................. C30B 25/02
[52] U.S. Cl. ........................ 117/89; 117/953; 117/954; 117/955
[58] Field of Search ............ 156/601, 610, 611, 612, 156/613, 614, DIG. 70, DIG. 73, DIG. 89

[56] References Cited

U.S. PATENT DOCUMENTS

| | | | |
|---|---|---|---|
| 3,658,585 | 4/1972 | Folkmann et al. | 156/611 |
| 3,892,490 | 7/1975 | Uetsuki et al. | 156/601 |
| 4,030,949 | 6/1977 | Horikoshi et al. | 156/612 |
| 4,058,430 | 11/1977 | Suntola et al. | 156/611 |
| 4,190,470 | 2/1980 | Walline | 156/611 |
| 4,203,799 | 5/1980 | Sugawara et al. | 156/601 |
| 4,426,237 | 1/1984 | Freeouf et al. | 156/611 |
| 4,430,149 | 2/1984 | Berkman | 156/613 |
| 4,529,455 | 7/1985 | Bean et al. | 156/611 |
| 4,834,831 | 5/1989 | Nishizawa et al. | 156/614 |

FOREIGN PATENT DOCUMENTS 2162206A 6/1986 United Kingdom.
2192198A 8/1988 United Kingdom.

OTHER PUBLICATIONS

DenBaars et al., "Atomic Layer . . . ", Jour. of Crystal Growth, 98 (1989) Nov. 1, Nos. 1/2, Amsterdam, NL 195–208.

Ozeki et al. "Growth of AlGaAs by Atomic . . . " Extended Abstracts of the 19th Conf. on Solid State Devices & Materials, Tokyo Aug. 25–27, 1987, pp. 475–478.

*Primary Examiner*—R. Bruce Breneman
*Assistant Examiner*—Felisa Garrett
*Attorney, Agent, or Firm*—Nixon & Vanderhye

[57] ABSTRACT

In a method of epitaxially growing a compound crystal, a plurality of crystal component gasses of a compound and reaction gas chemically reacting with the crystal component gasses are individually directed, in the predetermined order, onto a substrate crystal heated under vacuum. The crystal compound gasses and the reaction gas may be overlapped with each other. In a doping method in the above-described epitaxial growth method, the crystal component gasses and the compound gas of dopant are directed onto the substrate crystal and, subsequently, reaction gas, which chemically reacts with the compound gasses, is directed onto the substrate crystal. Also in this case, the reaction gas may be in overlapped relation to the component gas of dopant.

22 Claims, 6 Drawing Sheets

METHOD OF EPITAXIALLY GROWING COMPOUND CRYSTAL AND DOPING METHOD THEREIN

This is a continuation of application Ser. No. 07/860,253, filed Mar. 31, 1992, now abandoned, which is a continuation of application Ser. No. 07/642,965, filed Jan. 18, 1991, now abandoned.

BACKGROUND OF THE INVENTION

The present invention relates to methods of epitaxially growing compound crystals and doping methods therein and, more particularly, to a method of epitaxially growing a compound crystal, having controllability of film thickness of the monomolecular order as a technique for growing a thin-film crystal of a semiconductor and to a doping method in epitaxial growth of a compound crystal having strict controllability of dopant impurities in addition to the controllability of the film thickness of the monomolecular order.

Conventionally, molecular beam epitaxy (hereinafter referred to as "MBE"), metal organic-chemical vapor deposition (hereinafter referred to as "MO-CVD") and the like are generally employed as a technique for growth of a thin-film crystal for a semiconductor, for example. Particularly, in the case of a compound semiconductor, these methods have widely been used in manufacturing of a semiconductor device.

The aforesaid MO-CVD has widely been utilized for the reason that an apparatus for the MO-CVD can be used in which its structure or construction is relatively simple and easy and which is low in cost, for the reason that productivity is superior in which growing speed or rate is high and in which growing time is short, and for other reasons. However, it has been impossible for the MO-CVD to control growing film thickness of the order of a monomolecular layer.

The doping technique due to the MO-CVD has been arranged such that compound gas of an element for forming a semiconductor and compound gas of dopant are simultaneously directed onto a substrate crystal.

Further, the aforementioned MBE uses a method in which a raw material is heated and vaporized, and the vapor is evaporated or deposited onto the substrate crystal while controlling a molecular beam. A crystal film is extremely thin, and it is possible to sufficiently control composition, profile and crystal growing rate. Accordingly, the MBE is superior in controllability of the growing film thickness as compared with the aforesaid MO-CVD.

The doping method in the MBE is arranged such that vapor of a dopant element is vaporized onto the substrate crystal, simultaneously together with vapor of a constitutional element which serves as a raw material.

In order to produce a crystal superior in quality by the MBE, it is required for the case of, for example, GaAs to set the crystal growing temperature to high temperature of 500° to 600° C. It will become a problem that, because the temperature is high, in the case where steep or sharp impurity profile such as npn and pnp is produced, the impurities are redistributed. Further, since the MBE is based on an evaporation method, there are a problem of deviation from stoichiometry composition of a growing film, and a problem of high density of surface defects such as oval defect or the like.

Because of these defects, in recent years, attention has been paid to molecular-layer epitaxy (hereinafter referred to as "MLE") having controllability of film thickness of the order of a monomolecular layer.

The MLE is a method in which, in the case of crystal growth of III-group through V-group compounds, III-group compound gas and V-group compound gas are alternately directed onto a substrate crystal, and the crystal is grown a monomolecular layer by a monomolecular layer.

This technique is reported in a paper [J. Nishizawa, H. Abe and T. Kurabayashi; J. Electrochem. Soc. 132 (1985) 1197–1200] written by Jun-ichi Nishizawa et al, for example.

The aforesaid MLE utilizes adsorption and surface reaction of the compound gasses and, in the case of, for example, III- through V-group crystals, produces a monomolecular-film growing layer by introduction of the III-group compound gas and the V-group compound gas one by one.

In the manner described above, since the MLE utilizes monomolecular-layer adsorption of the compound gasses, growth can be done always of the order of the monomolecular layer within a certain pressure range even if pressures of the introducing gasses varies.

Furthermore, the MLE utilizes trimethylgallium (TMG) that is alkylgallium and arsine ($AsH_3$) that is a hydrogen compound of arsenic. However, in place of the above-mentioned TMG, the MLE uses triethylgallium (TEG) that is alkylgallium, whereby it is possible to produce a GaAs growing layer high in purity, by growth at further low temperature.

This technique is reported in a paper [J. Nishizawa, H. Abe, T. Kurabayashi and N. Sakurai; J. Vac. Sci. Technol. A4(3), (1986) 706–719] written by Jun-ichi Nishizawa et al, for example.

Moreover, the doping method of the GaAs due to the MLE is carried into practice such that, in addition to the compound gasses of the TEG and $AsH_3$, the compound gas of dopant is successively directed onto a surface of the substrate crystal separately. By doing so, it is possible to produce a crystal high in purity, which is controlled in impurity, including a high-dope crystal, at low temperature.

Furthermore, since the MLE grows the crystal film under low temperature, redistribution of impurities is extremely low, so that it is possible to realize steep or sharp impurity profile.

This technique is reported in a paper ]J. Nishizawa, H. Abe and T. Kurabayashi; J. Electrochem. Soc. Vol. 136, No. 2, pp. 478–484 (1989)] written by Jun-ichi Nishizawa et al, for example.

By the way, in order to produce, for example, a high-speed semiconductor device, it will be required to produce a growing film of impurity density further high in concentration, and to realize crystal growing at further low temperature.

Accordingly, it is desirable to further improve the doping method in the epitaxial growth of the molecular layer.

SUMMARY OF THE INVENTION

In view of the above problems, it is an object of the invention to provide a method of epitaxially growing a compound crystal, which is capable of producing a crystal high in purity, at low-temperature growth, on the basis of a principal concept of molecular-layer epitaxy.

It is another object of the invention to provide a doping method in epitaxial growth of a compound crystal, which is capable of producing a growing film of impurity density high in concentration, strictly impurity-controlled at low temperature, of the order of a monomolecular layer.

According to the invention, there is provided a method of epitaxially growing a compound crystal, comprising the step of:

individually directing a plurality of crystal component gasses of a compound and reaction gas chemically reacting with the crystal component gasses, in the predetermined order, onto a substrate crystal heated under vacuum.

According to the invention, there is also provided a method of epitaxially growing a compound crystal, comprising the step of:

directing a plurality of crystal component gasses of a compound and reaction gas chemically reacting with the crystal component gasses, in the predetermined order and in an overlapped manner, onto a substrate crystal heated under vacuum.

According to the invention, there is further provided a doping method in epitaxial growth of a compound crystal in which a plurality of crystal component gasses of a compound and compound gas of dopant are separately introduced, in the predetermined order, onto a substrate crystal heated under vacuum, the method comprising the steps of:

directing the crystal component gasses and the compound gas of dopant onto the substrate crystal, and subsequently, directing reaction gas which chemically reacts with the compound gasses, onto the substrate crystal.

According to the invention, there is provided a doping method in epitaxial growth of a compound crystal in which a plurality of crystal component gasses of a compound and compound gas of dopant are separately introduced, in the predetermined order, onto a substrate crystal heated under vacuum, the method comprising the steps of:

directing the crystal component gasses and the compound gas of dopant onto the substrate crystal, and subsequently, directing reaction gas which chemically reacts with the compound gasses, onto the substrate crystal, in overlapped relation to the component gas of dopant.

With the above arrangement of the invention, the reaction gas is directed onto the substrate crystal heated under vacuum in the predetermined order, in addition to the gas containing the crystal growing component such as GaAs or the like, whereby the component gasses and the reaction gas chemically react with each other on the substrate crystal. Thus, it is possible to produce a crystal high in purity, by growth at low temperature.

Further, in the doping method in which the component gasses and the compound gas of dopant are individually or separately introduced onto the substrate crystal heated under vacuum, in the predetermined order, the reaction gas is supplied in addition to the component gasses and the dopant gas, and chemically react with the latter at low temperature. Thus, it is possible to produce a crystal which is strictly impurity-controlled at low temperature.

If the crystal component gasses are alternately directed onto the substrate heated under vacuum, surface adsorption or crystallization accompanied with accumulation and surface reaction occurs successively, so that the semiconductor monomolecular crystal is grown a monomolecular layer by a monomolecular layer.

For example, for crystal growth of GaAs, the crystal component gasses utilize TMG (trimethylgallium), TEG (triethylgallium), DMGaCl (dimethylgallium chloride), DEGaCl (diethylgallium chloride), or $GaCl_3$ (gallium trichloride), as a raw-material gas of Ga.

Moreover, $AsH_3$ (arisine), TMAs (trimethylarsenic), TEAs (triethylarsenic), or $AsCl_3$ (arsenic trichloride) is employed as a raw-material gas of As.

In the case of growth of AlGaAs, TMA (trimethylaluminium), TEA (triethylaluminium), TIBA (triisobutylaluminium), DMAlH (dimethylaluminium hydride), DEAlH (diethylaluminium hydride), DMAlCl (dimethylaluminium chloride), DEAlCl (diethylaluminium chloride), or $AlCl_3$ (aluminum trichloride) is used as a raw material of Al in addition to the raw-material gasses of Ga and As.

After or during the raw-material gasses of Ga, As and Al have been or are introduced, the reaction gas chemically reacting with the aforesaid gasses is fed, whereby it is possible to remove an alkyl group such as a methyl group, an ethyl group or the like and a functional group of the surface adsorbent such as Cl, H or the like.

By doing so, it is possible to prevent pollution or contamination of C (carbon) from the alkyl group and mixing of Cl into or with the crystal.

Further, by removal of the aforementioned H, atoms of a substance that is the raw material are exposed to the surface, whereby the raw-material gas supplied at the next time is surface-adsorbed efficiently. Thus, strict control of the monomolecular-layer growth can be made possible.

In the doping method in the crystal growing method of the above-described GaAs and AlGaAs, the compound gas containing the dopant is also introduced for a predetermined period of time. That is, the component gasses and the compound gas of dopant are separately introduced in the predetermined order.

The compound gas of dopant includes, as a compound of n-type impurity, a VI-group organic metal such as DMSe (dimethyl selenium), DESe (diethyl selenium), DMS (dimethyl sulfur), DES (diethyl sulfur), DMTe (dimethyl tellurium), DETe (diethyl tellurium) or the like, a VI-group hydrogen compound such as $H_2S$ (hydrogen sulfide), $H_2Se$ (hydrogen selenide) or the like, or a IV-group compound such as $SiH_4$, $Si_2H_6$, $Si_3H_8$, $Si(CH_3)_4$ or the like.

Furthermore, as the compound of p-type impurity, there is DMZn (dimethylzinc), DEZn (diethylzinc), DMCd (dimethylcadmium), DECd (diethylcadmium), Bi-CPMg (bis-cyclopentadienyl magnesium), C (carbon) and the like from the methyl group such as $GeH_4$ and TMG, or the like.

In order to direct these gasses onto the substrate crystal to efficiently take in the crystal as donor and acceptor, it is required to remove the remaining functional group bonded with the element on the crystal surface after introduction of these gasses. For this reason, the reaction gas is introduced in various phases after or during the compound gas of dopant has been or is introduced, and the functional group is removed by the surface reaction, whereby doping of the pure element is made possible.

Further, since doping is done at a process of growth a molecular layer by a molecular layer, site of the crystal can be controlled which the dopant enters. Thus, it is possible to produce a crystal which is doped and which is high in safety.

As described above, the method of epitaxially growing the compound crystal, according to the invention, is arranged such that the reaction gas is directed onto the substrate crystal in the predetermined order in addition to the crystal component gasses. Thus, it is possible to produce the crystal high in purity, at low temperature.

Furthermore, the doping method in the epitaxial crystal growth for the compound crystal is arranged such that the reaction gas is directed onto the substrate crystal heated under vacuum in the predetermined order, in addition to the crystal component gasses and the dopant compound gas. Thus, it is possible to produce the crystal strictly impurity-controlled at low temperature. Further, it is possible to produce the crystal to which impurities are added at high concentration.

DETAILED DESCRIPTION OF THE DRAWINGS

Figure 3A:
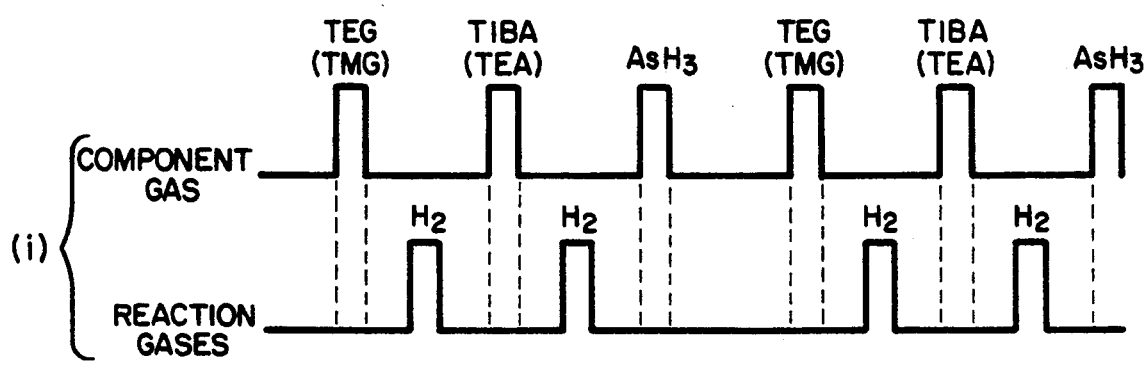
Figure 3B:
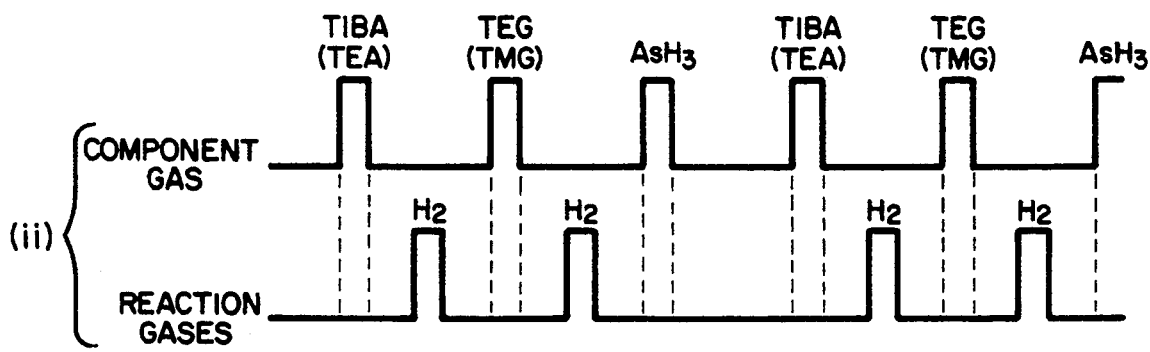
Figure 3C:
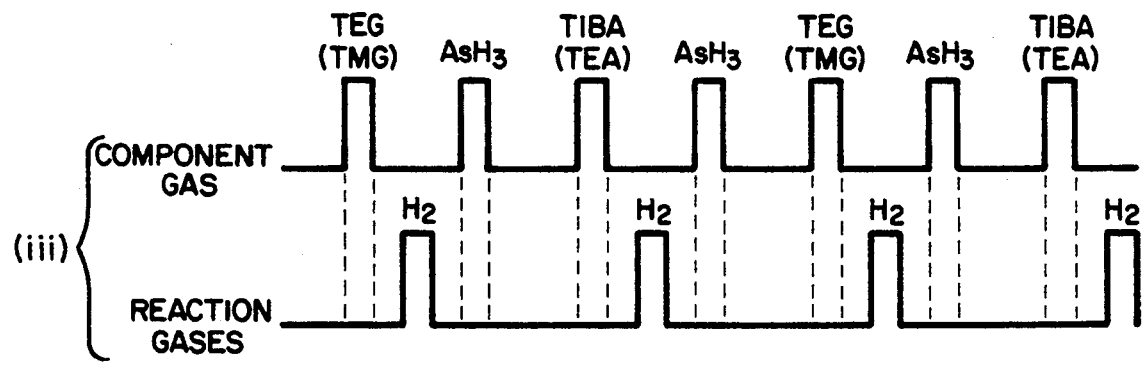
Figure 4A:
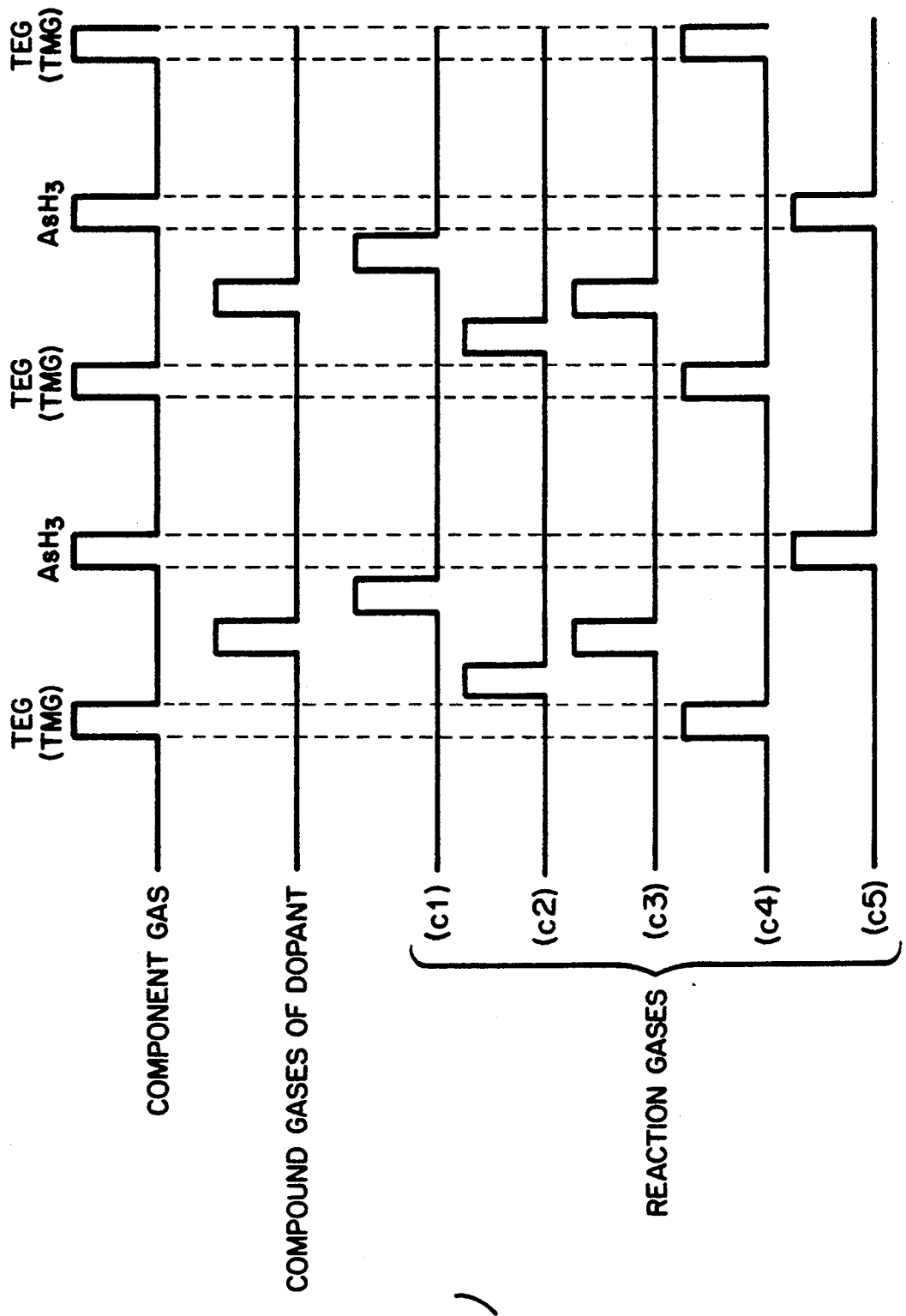
Figure 4B:
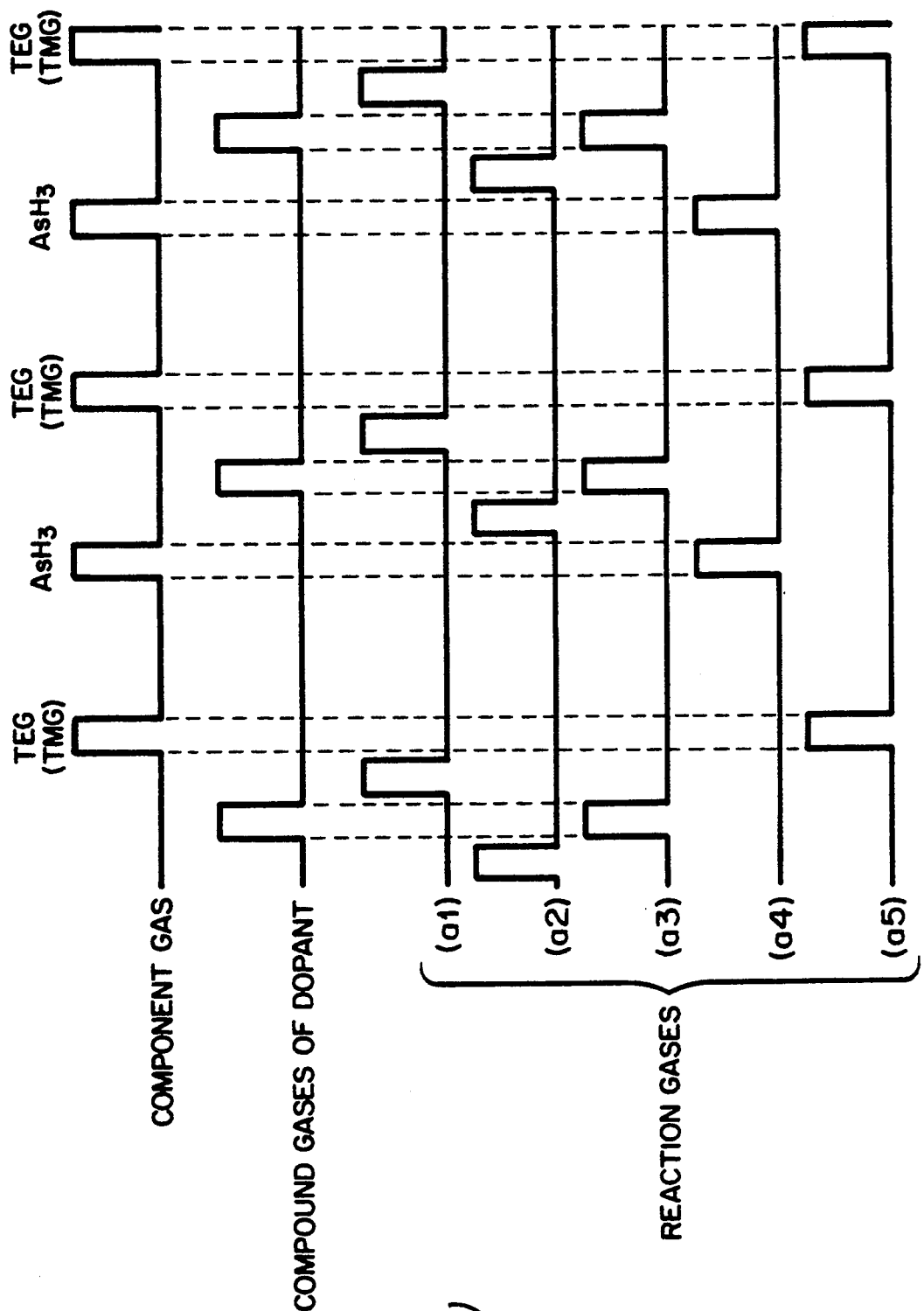
Figure 5:
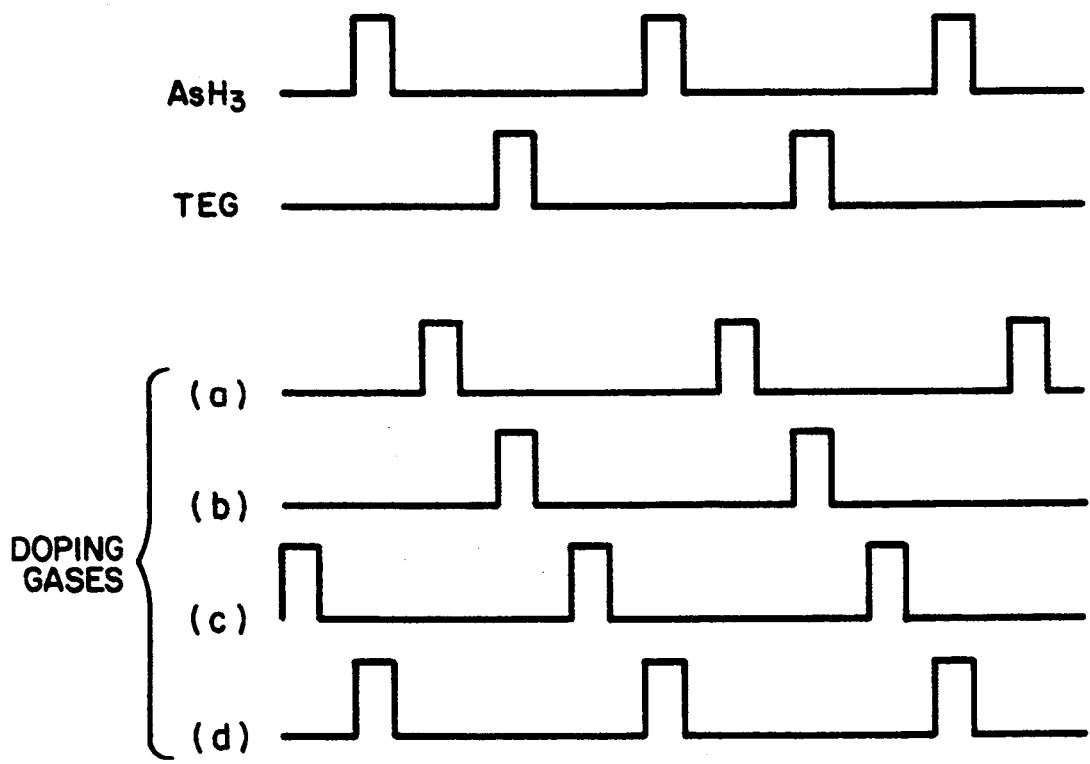

FIGS. 3(A) through 3(C) are graphical representation showing a gas introducing method in molecular-layer epitaxy of non-dope $Al_xGa_{1-x}As$ in the case where $H_2$ is used as the reaction gas;

FIG. 4(A) is graphical representation showing a doping method due to a C mode in the molecular-layer epitaxy of GaAs; and FIG. 4(B) is a graphical representation showing a doping method due to an A mode in the molecular-layer epitaxy of GaAs; and FIG. 5 is a time chart relating to the conventional gas introducing method of dopant compound gas in molecular-layer epitaxy.

DESCRIPTION OF THE EMBODIMENTS

Figure 1:
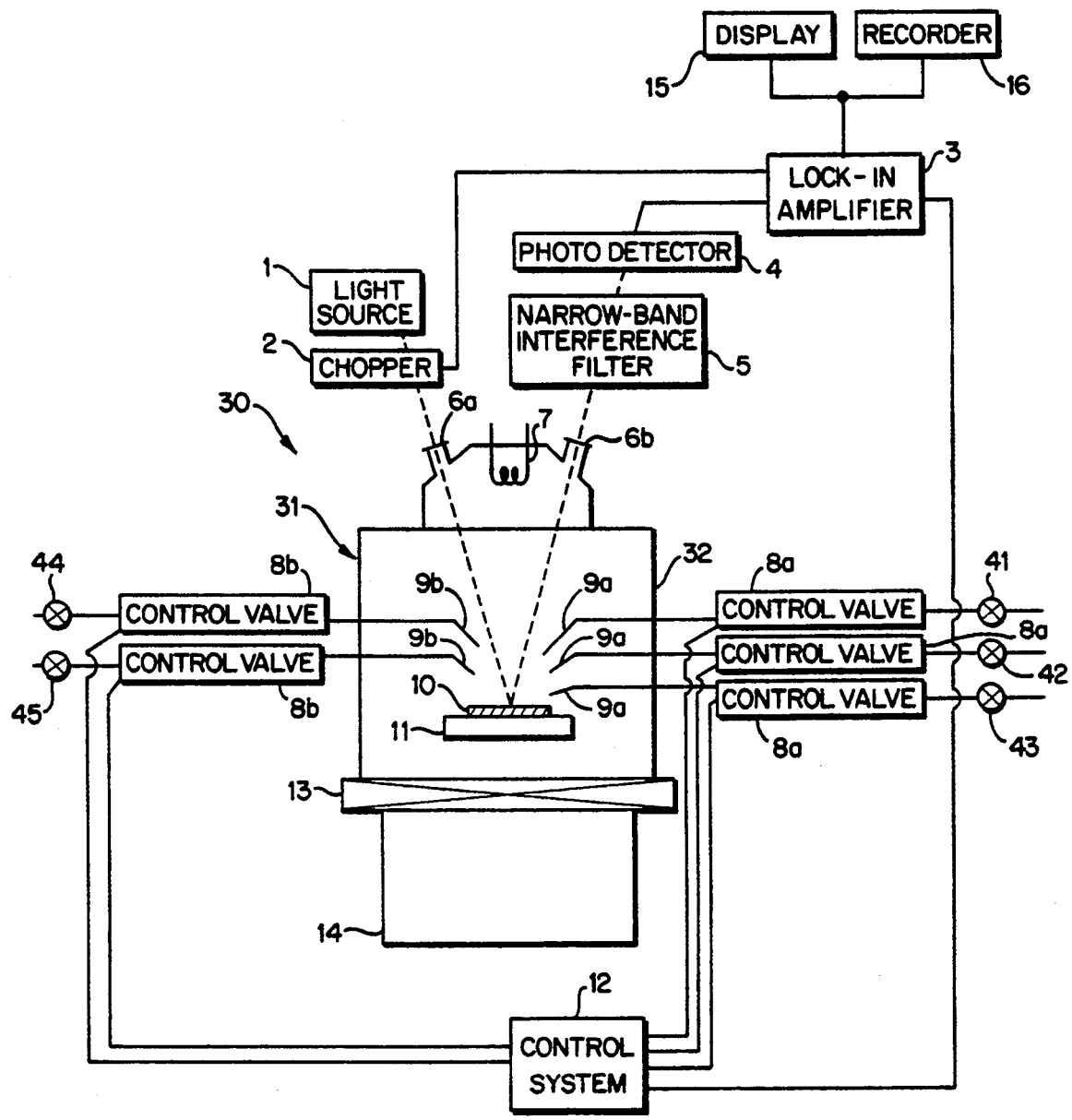
FIG. 1 is a schematic view of an epitaxial growing apparatus for carrying out an epitaxial growing method for a chemical compound crystal, according to an embodiment of the invention, the epitaxial growing apparatus comprising an $Al_xGa_{x-1}As$ and/or GaAs molecular-layer epitaxial growing device, using reaction gas.

Referring first to FIG. 1, there is shown an epitaxial growing apparatus which comprises a GaAs and/or $Al_xGa_{1-x}As$ molecular-layer epitaxial growing device 30. The epitaxial growing device 30 is reported in a paper [J. Nishizawa, H. Abe and T. Kurabayashi; J. Electrochem. Soc. 132 (1985) 1197-1200] written by Jun-ichi Nishizawa et al, for example.

As shown in FIG. 1, the GaAs and/or $Al_xGa_{1-x}As$ molecular-layer epitaxial growing device 30 comprises a hermetic or closed container 31 in which a closed crystal growing chamber 32 is defined. For example, pressure within the crystal growing chamber 32 is evacuated, for the first time, to $10^{-6}$ to $10^{-11}$ Torr and, subsequently, chemical compound gasses that are a raw material are introduced into the crystal growing chamber 32 at $10^{-1}$ to $10^{-7}$ Torr with predetermined sequence while the crystal growing chamber 32 is evacuated. A gate valve 13 is arranged at a location below the closed container 31. A vacuum evacuation device 14 such as a turbo molecular pump or the like is arranged at a location below the gate valve 13. The crystal growing chamber 32 is arranged at a location above the gate valve 13. A GaAs single-crystal substrate susceptor 11 and a GaAs single-crystal substrate 10 are accommodated within the crystal growing chamber 32. Further, within the crystal growing chamber 32, a plurality of component-gas introducing nozzles 9a connected respectively to ports 41 through 43, and a pair of reaction-gas introducing nozzles 9b connected respectively to ports 44 and 45, are arranged in opposed relation to each other, in facing relation to the GaAs single-crystal substrate 10. The component gasses are comprised by Al compound, Ga compound and As compound. The introducing nozzles 9a and the reaction-gas introducing nozzles 9b are provided with their respective control valves 8a and 8b. These control valves 8a and 8b are connected to a control system 12.

Reaction gas is introduced into the crystal growing chamber 32 through the control valves 8b and the nozzles 9b, respectively. On the other hand, the Al compound gas and the Ga compound gas are introduced into the crystal growing chamber 32 through two of the valves 8a and corresponding two of the nozzles 9a, respectively. $AsH_3$ that is one of the crystal component gasses is introduced into the crystal growing chamber 32 through the remaining valve 8a and the remaining nozzle 9a.

Furthermore, a GaAs single-crystal substrate heating element 7 is arranged at an upper portion of the crystal growing chamber 32. An incident window 6a and an extracting window 6b, through which a light can pass, are provided at a periphery of the crystal growing chamber 32 and are arranged respectively on both sides of the GaAs single-crystal substrate heating element 7.

The arrangement is such that the light from a light source 1 is emitted to a growing film of the GaAs single-crystal substrate 10 from a predetermined direction. The light source 1 is arranged on the outside of the incident window 6a in facing relation thereto. The light source 1 is a source of a parallel beam, and is selected from a He-Ne laser, a semiconductor laser, a light-emitting diode, a mercury lamp and an argon ion laser. A chopper 2 for chopping the light is arranged between the incident window 6a and the light source 1. Moreover, a photo detector 4 for the light reflected from the GaAs single crystal substrate 10 is arranged on the outside of the extracting window 6b in facing relation thereto. A narrow-band interference filter 5 for removing a stray light from the reflected light is arranged between the extracting window 6b and the photo detector 4.

The chopper 2 and the photo detector 4 are connected to a lock-in amplifier 3. The lock-in amplifier 3 is provided with a display 15 and a recorder 16. The lock-in amplifier 3 is connected to the control system 12.

In operation, the control valves 8a and 8b for the reaction gas, the compound gas and the crystal component gasses are first controlled by the control system 12. By doing so, the Al compound gas and the Ga compound gas are alternately introduced into the crystal growing chamber 32 and are directed onto the GaAs single-crystal substrate 10 which is controlled in temperature by the GaAs single-crystal substrate heating element 7, so that GaAs and/or $Al_xGa_{1-x}$ is epitaxially grown.

The reflected-light intensity at the GaAs crystal surface is measured as follows. That is, first, the light from the light source 1 arranged on the outside of the closed container 31 is chopped by the chopper 2. The light chopped is emitted to the GaAs single crystal through the incident window 6a. The light reflected is detected by the photo detector 4 such as an Si photodiode or the like, through the other extracting window 6b. The filter 5 is arranged between the photo detector 4 and the extracting window 6b, and removes the stray light from the light incident upon the photo detector 4 before the detection. A detecting output from the photo detector 4 is processed in signal by the lock-in amplifier 3. Subsequently, outputs are successively issued from the lock-in amplifier 3 to the control system 12, the display 15 and the recorder 16.

Regarding the above-described epitaxial growing apparatus, reference should be made to U.S. Ser. No. 617,554, filed on Nov. 26, 1990, entitled "METHOD OF AND APPARATUS FOR EPITAXIALLY GROWING CHEMICAL-COMPOUND CRYSTAL".

Prior to describe the preferred embodiment of the invention, the conventional doping method will first be described with reference to FIG. 5. FIG. 5 shows a time chart relating to a doping method which has conventionally been carried into practice, in molecular-layer epitaxy. That is, FIG. 5 illustrates an example of molecular-layer epitaxy for GaAs of [TEG-AsH$_3$].

Specifically, in a crystal growing method in which TEG and AsH$_3$ are alternately introduced, with their respective predetermined pressures for predetermined time, into the crystal growing chamber 32 illustrated in FIG. 1 and are directed onto the substrate crystal 10, any one of the following gas-introducing modes (a) through (d) is selected, and chemical compound gasses are directed onto the substrate crystal 10:

(a) Mode in which the compound gas of dopant is introduced in synchronism with evacuation of AsH$_3$;
(b) Mode in which the compound gas of dopant is introduced in synchronism with introduction of TEG;
(c) Mode in which the compound gas of dopant is introduced in synchronism with evacuation of TEG; and
(d) Mode in which the compound gas of dopant is introduced in synchronism with introduction of AsH$_3$.

Figure 2:
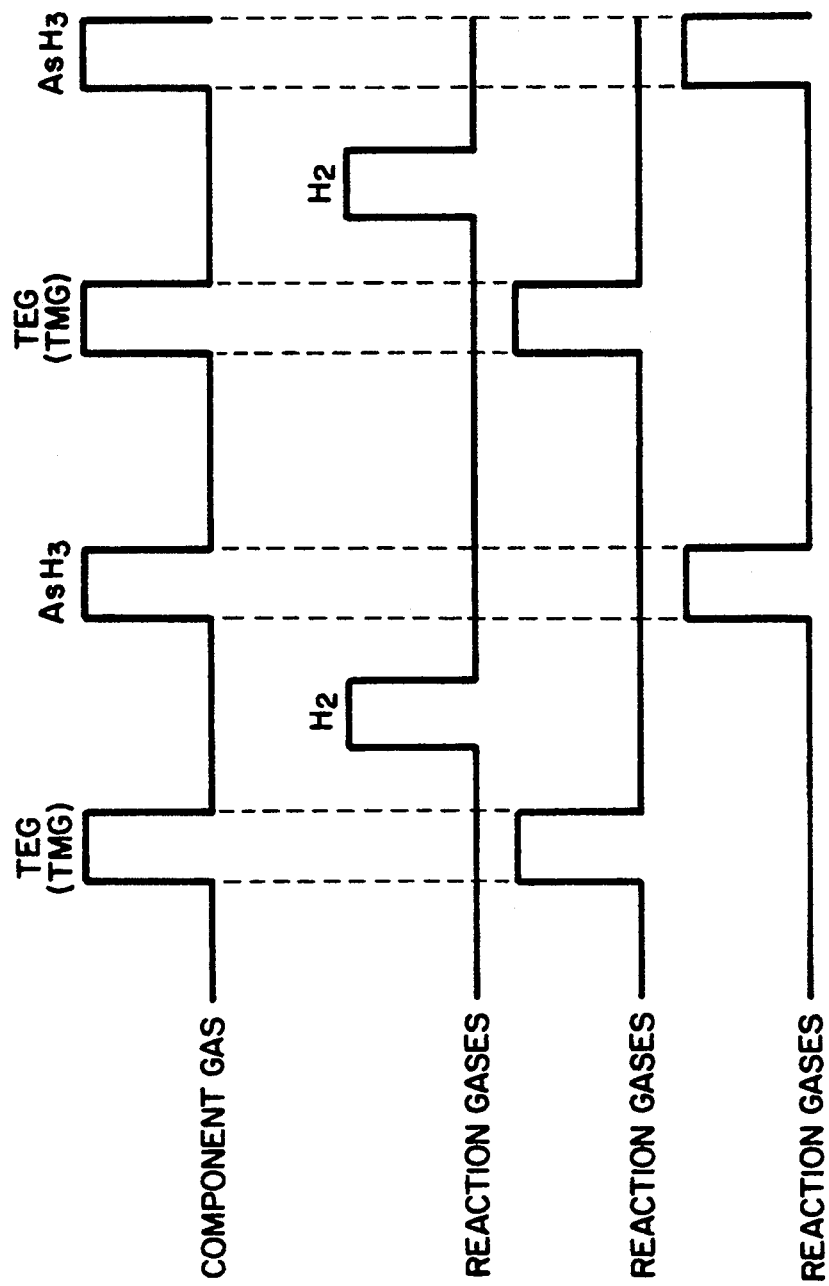
FIG. 2 is graphical representation showing a gas introducing method in molecular-layer epitaxy of non-dope GaAs in the case where $H_2$ is used as reaction gas.

Referring next to FIG. 2, there is shown an embodiment of epitaxial crystal growth of a GaAs molecular layer of non-dope, according to the invention.

The crystal component gasses include TEG or TMG as raw-material gas of Ga, and AsH$_3$ as raw-material gas of As. Further, H$_2$ is used as reaction gas which reacts with the crystal component gasses.

These gasses are introduced into the crystal growing chamber and are directed onto the substrate crystal heated under vacuum, with gas introducing procedure illustrated in FIG. 2. As the method of introduction of the gasses chemically reacting, the arrangement may be such that the gasses are introduced simultaneously with TEG or in a manner of partially or completely overlapped with the TEG.

In the manner described above, organic metal gas of Ga is directed onto the substrate crystal and, subsequently, H$_2$ that is the reaction gas is introduced. By doing so, C$_2$H$_5$ or CH$_3$ within Ga-(C$_2$H$_5$)$_x$ (0<x$\leq$3) or Ga-(CH$_3$)$_x$ (0<x$\leq$3), which forms a surface adsorption layer, reacts with H$_2$ and is desorbed. Accordingly, it is possible to form an epitaxial crystal growing film, with which C (carbon) is not mixed, on the substrate crystal. It is also possible to realize crystal growth at low temperature.

As the component gas of Ga, there are DMGaCl, DEGaCl and GaCl$_3$, other than the gasses referred to above. If, however, the reaction gas H$_2$ is introduced after introduction of the above-described gasses, it is possible to produce a GaAs crystal high in purity, in a manner similar to that described previously.

Further, in the case where organic metal gas and chloride such as TMA$_s$, TEA$_s$, A$_s$Cl$_3$ and the like are used as the component gas of As, the reaction gas H$_2$ is introduced after the above-mentioned gas has been introduced, whereby it is possible to produce a GaAs crystal high in purity, by low-temperature growth, in a manner similar to that described above.

FIGS. 3(A) through 3(C) show an embodiment of Al$_x$Ga$_{1-x}$As of non-dope, according to the invention.

The crystal component gasses utilize TEG or TMG as a raw-material gas of Ga, and TIBA or TEA as raw-material gas of Al. Furthermore, the crystal component gasses employ AsH$_3$ as raw-material gas of As.

(i) through (iii) illustrated in FIGS. 3(A) through 3(C) represent gas introduction procedure of Al$_x$Ga$_{1-x}$As growth. Further, the time through which the H$_2$ is introduced may be simultaneous with the gasses including TEG or TMG and Al, or the former and latter times may partially or completely be overlapped with each other.

In either case, H$_2$ that is the reaction gas is introduced after or during the organic metal gasses of Ga and As have been or are introduced, whereby it is possible to produce Al$_x$Ga$_{1-x}$As crystal high in purity, by low-temperature growth.

Similarly also to the case where, other than the aforesaid crystal component gasses, DMGaCl, DEGaCl and GaCl$_3$ are used as the raw-material gasses, and TMA, DMAlH, DEAlH, DMAlCl, DEAlCl and AlCl$_3$ are employed as the raw-material gas of Al, H$_2$ that is the reaction gas is introduced after or during the aforementioned gasses have been or are introduced, whereby it is possible to produce Al$_x$Ga$_{1-x}$As crystal high in purity, by low-temperature growth.

Moreover, in the case where the organic metal gas and chloride such as TMAs, TEAs and AsCl$_3$ are used as the raw-material gas of As, the H$_2$ that is the reaction gas is introduced after or during the aforesaid gasses have been or are introduced, whereby it is possible to produce the Al$_x$Ga$_{1-x}$As crystal high in purity, by low-temperature growth.

The examples illustrated in FIGS. 2 and 3(A) through 3(C) are directed to the crystal growing method of GaAs and Al$_x$Ga$_{1-x}$As. It is to be noted, however, that a similar method can be applied also to molecular-layer epitaxial crystal growth such as GaP, InP, AlAs, InAs, InSb, In$_x$Ga$_{1-x}$As, Al$_x$Ga$_{1-x}$P, InAs$_y$P$_{1-y}$ or the like.

Furthermore, FIG. 4(A) shows an embodiment of a doping method in the molecular-layer epitaxial crystal growth of GaAs, according to the invention.

As illustrated in FIG. 4(A), it will be considered that TEG or TMG of crystal growing gas and AsH$_3$ are alternately directed onto a substrate crystal heated under vacuum, to perform crystal growth. At this time, in a doping method in which compound gas of the dopant is introduced in synchronism with evacuation and/or introduction of TEG or TMG, the reaction gas is introduced by the following (c1) through (c5) manners (in this connection, the doping method corresponds to the c-mode illustrated in FIG. 5):

(c-1) The reaction gas is introduced after the compound gas of the dopant has been introduced;
(c-2) The reaction gas is introduced just or immediately before the compound gas of the dopant is introduced;
(c-3) The reaction gas is introduced during the period for which compound gas of the dopant is introduced;

(c-4) The reaction gas is introduced at a partial or complete time during introduction of TEG with dopant; and (c-5) The reaction gas is introduced in overlapped relation to $AsH_3$.

In the case of the compound gas of the n-type dopant, a VI-group organic metal compound such as DMS, DES, DMSe, DESe, DMTe, DETe or the like, a VI-group hydride such as $H_2S$, $H_3Se$ or the like, a IV-group hydride such as $SiH_4$, $Si_2H_5$, $Si_3H_6$ or the like, a IV-group organic compound such as $Si(CH_3)_4$, or the like, is used as the compound gas of dopant.

Further, a II-group organic metal compound such as DMCd, DECd, Bi-CPMg or the like, a IV-group hydride such as $GeH_4$ or the like, C (carbon) from a methyl group such as TMG or the like is used as the compound of the p-type dopant.

Both the compounds of the n-type and p-type dopant can broadly be divided into an organic metal compound and a hydride.

Furthermore, in place of $H_2$, the crystal component gasses such as TEG or TMG and $AsH_3$ may be introduced as the reaction gas. Alternatively, compound gas of dopant may be introduced which is different in kind or type from the compound gas of dopant which is introduced in synchronism with evacuation of the TEG or TMG.

For example, the following items (1) and (2) correspond to (c1) mode shown in FIG. 4(A):

$$(TEG\text{-}Si_2H_6\text{-}TEG\text{-}AsH_3), \text{ and} \quad (1)$$

$$(TEG\text{-}Si_2H_6\text{-}DESe\text{-}AsH_3. \quad (2)$$

$Si_2H_6$ is used as the compound gas of dopant introduced in synchronism with evacuation of the TEG or TMG.

The above-described item (1) illustrates the case where TEG that is one of the crystal component gasses is employed as reaction gas, while the item (2) illustrates the case where DESe that is the compound gas of dopant is used as the reaction gas.

Furthermore, as shown in FIG. 4(B), in the doping method in which the compound gas of dopant is introduced in synchronism with evacuation of $AsH_3$, the reaction gas is introduced in the following modes (a1) to (a5) (in this connection, the doping method corresponds to the a-mode illustrated in FIG. 5):

(a1) The reaction gas is introduced after introduction of the compound gasses;

(a2) The reaction gas is introduced immediately before introduction of the compound gasses;

(a3) The reaction gas is introduced in synchronism with introduction of the compound gasses during the latter introduction;

(a4) The reaction gas is introduced in staggered relation to introduction of the compound gasses of $AsH_3$ during the latter introduction; and (a5) The reaction gas is introduced simultaneously with introduction of TEG.

The VI-group organic metal compound, the VI-group hydride, the IV-group hydride, the IV-group organic metal compound, II-group organic metal compound, TMG and the like are used in the compound gas of dopant.

Moreover, in place of $H_2$, crystal component gasses such as TEG or TMG, $AsH_3$ and the like may be introduced as the reaction gas. Alternatively, compound gas of dopant may be introduced which is different in type from the compound gas of dopant introduced in synchronism with and at evacuation of $AsH_3$.

For example, the following items (3), (4) and (5) correspond to the (a1) mode illustrated in FIG. 4(B):

$$(TEG\text{-}AsH_3\text{-}DESe\text{-}AsH_3); \quad (3)$$

$$(TEG\text{-}AsH_3\text{-}DESe\text{-}H_2); \text{ and} \quad (4)$$

$$(TEG\text{-}AsH_3\text{-}DESe\text{-}H_2Se). \quad (5)$$

DESe is employed as the compound gas of dopant which is introduced in synchronism with and at evacuation of the $AsH_3$.

The aforesaid item (3) illustrates the case where $AsH_3$ of the crystal component gasses is employed as the reaction gas, while the item (4) illustrates the case where $H_2$ is utilized as the reaction gas. On the other hand, the item (5) illustrates the case where $H_2Se$ of the compound gas of dopant is used as the reaction gas.

In the example of the item (5), since the organic metal compound of Se and the hydride of Se surface-react with each other, it is possible to bring doping density of Se to high density of $n \geq 2 \times 10^{19}$ cm$^{-3}$ at the room temperature.

Furthermore, in the aforementioned examples (3) and (4), the ethyl group of the adsorbed DESe or compound of Se reacts with $AsH_3$ or $H_2$ of the reaction gas and is desorbed. Thus, it is possible to reduce mixing of C (carbon) into a crystal growing film. Further, since the dopant compound and the hydride of the reaction gas react with each other at low temperature, it is possible to reduce temperature of the crystal growth. Accordingly, since the dopant is not redistributed, it is possible to produce the growing film high in purity.

As described above giving the examples, it is necessary for the reaction gas to select gasses different in type from the gasses directed onto the substrate crystal in precedence.

That is, if the preceding introducing gasses are chloride or an organic metal compound, hydride is introduced as the reaction gas, to hydrogen-reduce Cl, $CH_3$ or the like within M-Cl$_n$ or M-(CH$_3$)$_n$ (M is a metal element) so that the Cl, $CH_3$ or the like is removed.

Further, if the preceding introducing gas is hydride, organic metal gas or the like is selected as the reaction gas, making it possible to extremely raise the surface adsorption rate.

Various examples of combination of reaction gas and compound gas of dopant in the doping method in the GaAs molecular-layer epitaxial crystal growth according to the invention are depicted in the below table 1.

TABLE 1

COMBINATION OF REACTION GAS AND COMPOUND GAS OF DOPANT
OF DOPING METHOD
IN GaAs MOLECULAR-LAYER EPITAXIAL CRYSTAL GROWTH

| DOPANT COMPOUND | | | | REACTION GAS | |
| --- | --- | --- | --- | --- | --- |
| ORGANIC | n-TYPE | | DMS | $H_2$ | |
| METAL | IMPURITIES | | DES | $AsH_3$ | — (COMPONENT GASSES) |

TABLE 1-continued

COMBINATION OF REACTION GAS AND COMPOUND GAS OF DOPANT
OF DOPING METHOD
IN GaAs MOLECULAR-LAYER EPITAXIAL CRYSTAL GROWTH

| DOPANT COMPOUND | | | REACTION GAS | |
|---|---|---|---|---|
| COMPOUND | | DMSe | $H_2S$ | (HYDRIDE n-TYPE IMPURITIES) |
| | | DESe | $H_2Se$ | |
| | | DMTe | $SiH_4$ | |
| | | DETe | $Si_2H_6$ | |
| | | $Si(CH_3)_4$ | $Si_3H_8$ | |
| | p-TYPE IMPURITIES | DMCd | $AsH_3$ | — (COMPONENT GASSES) |
| | | DECd | | |
| | | Bi-CPMg | $GeH_4$ | — (HYDRIDE p-TYPE IMPURITIES) |
| | | TMG | | |
| | | DMZn | $H_2$ | |
| | | DEZn | | |
| HYDRIDE | n-TYPE IMPURITIES | | TMG | (COMPONENT GASSES) |
| | | | TEG | |
| | | $H_2S$ | DMS | (ORGANIC METAL n-TYPE IMPURITIES) |
| | | $H_2Se$ | DES | |
| | | $SiH_4$ | DMSe | |
| | | $Si_2H_6$ | DESe | |
| | | $Si_3H_8$ | DMTe | |
| | | | DETe | |
| | | | $Si(CH_3)_4$ | |
| | p-TYPE IMPURITIES | $GeH_4$ | TMG | (COMPONENT GASSES) |
| | | | TEG | |
| | | | DMCd | (ORGANIC METAL p-TYPE IMPURITIES) |
| | | | DECd | |
| | | | Bi-CPMg | |
| | | | TMG | |
| | | | DMZn | |
| | | | DEZn | |

The above-described doping method in the epitaxial crystal growth, according to the invention, can also be applied to molecular-layer epitaxial crystal growth such as $Al_xGa_{1-x}As$, GaP, InP, AlAs, InAs, $InSb_2$, $In_x$-$Ga_{1-x}As$, $Al_xGa_{1-x}P$, $InAs_yP_{1-y}$ or the like, in addition to GaAs.

Thus, the invention is directed to a technique which is extremely suitable in manufacturing of an active layer required for LSI or super high-speed IC.

What is claimed is:

1. A method of epitaxially growing a Group III-V compound crystal by a gas introduction cycle, wherein the step forming a maximum thickness of one monolayer thickness of said compound crystal is repeated, said method comprising the steps of:
   introducing onto a substrate crystal heated under vacuum, for a time until the monolayer is formed, a first crystal component gas of a Group III-V compound;
   stopping supply of said first crystal component gas to thereby evacuate said first crystal component gas except for first crystal component gas adsorbed on a growing surface;
   introducing a reaction gas which chemically reacts with molecules formed from said first crystal component gas adsorbed on said surface;
   evacuating said reaction gas;
   introducing said second crystal component gas of a Group III-V compound; and
   evacuating said second crystal component gas.

2. A method according to claim 1, wherein said Group III-V compound crystal is one of GaAs, $Al_x$-$Ga_{1-x}As$, GaP, InP, AlAs, InAs, InSb, $In_xGa_{1-x}As$, $Al_xGa_{1-x}P$, $InAs_xP_{1-x}$, and said crystal component gases are gases containing Al, Ga and In of Group III and P, As and Sb of group V.

3. A method according to claim 1, wherein said reaction gas is $H_2$.

4. A method of epitaxially growing a Group III-V compound crystal, said method comprising the steps of:
   introducing onto a substrate crystal heated under vacuum a crystal component gas of a compound of Group III, Group V and a reaction gas which chemically reacts with said crystal component gas, introduction of said gases for one cycle enabling a film thickness of one monolayer to be grown, said reaction gas being introduced only for a certain time during one cycle, said reaction gas being introduced in an overlapped manner with said crystal component gas;
   evacuating said crystal component gas and said reaction gas;
   introducing a further crystal component gas of a compound of Group III, Group V and a reaction gas which chemically reacts with said further crystal component gas, introduction of said further crystal component gas and reaction gas for one cycle enabling a film thickness of one monolayer to be grown at a maximum, said reaction gas being introduced in an overlapped manner with said further crystal component gas.

5. A method according to claim 4, wherein said crystal component gases and said reaction gas are partially overlapped with each other.

6. A method according to claim 4, wherein said crystal component gases and said reaction gas are completely overlapped with each other.

7. A method according to claim 4, wherein said Group III-V compound crystal is one of GaAs, $Al_x$-$Ga_{1-x}As$, GaP, InP, AlAs, InAs, InSb, $In_xGa_{1-x}As$, $Al_xGa_{1-x}P$, $InAs_xP_{1-x}$, and said crystal component gases are gases containing Al, Ga and In of Group III and P, As and Sb of Group V.

8. A method according to claim 4, wherein said reaction gas is $H_2$.

9. A doping method in epitaxial growth of a Group III–V compound crystal in which a plurality of crystal component gases of a compound of Group III, Group V and a component gas of dopant are separately introduced onto a substrate crystal heated under vacuum, introduction of said gases for one cycle enabling a film thickness of one monolayer to be grown at a maximum, said method comprising the steps of:

introducing a crystal component gas of a compound of Group III, Group V and a compound gas of dopant separately onto said substrate crystal;

introducing a reaction gas which chemically reacts with said crystal component gas, said reaction gas being introduced only for a certain time during one cycle, said reaction gas being introduced after introduction of at least one of said crystal component gas and said compound gas of dopant;

evacuating said reaction gas after introduction of at least one of said crystal component gas and compound gas of dopant.

10. A method according to claim 9, wherein said reaction gas is $H_2$.

11. A method according to claim 9, wherein said reaction gas is one of said crystal component gases which is different in type from the crystal component gases introduced onto said substrate crystal.

12. A method according to claim 9, wherein said reaction gas is a compound gas of dopant which is different in type from the compound gas of dopant introduced onto said substrate crystal.

13. A method according to claim 9, wherein said Group III–V compound crystal is one of GaAs, $Al_x Ga_{1-x}As$, GaP, InP, AlAs, InAs, InSb, $In_x Ga_{1-x}As$, $Al_x Ga_{1-x}P$, $InAs_x P_{1-x}$, and said crystal component gases are gases containing Al, Ga and In of the Group III and P, As and Sb of Group V.

14. A method according to claim 9, wherein said compound gas of dopant is selected from the group consisting of compound gases of Si, Ge, S, Se, Te, Zn, Cd and Mg.

15. A doping method in epitaxial growth of a Group III–V compound crystal in which a plurality of crystal component gases of a compound of Group III, Group V and a compound gas of dopant are separately introduced onto a substrate crystal heated under vacuum, introduction of said gases for one cycle enabling a film thickness of one monolayer to be grown, said method comprising the steps of:

introducing a crystal component gas of a compound of Group III, Group V and a compound gas of dopant separately onto said substrate crystal;

introducing a reaction gas which chemically reacts with at least one of said crystal component gas and said compound gas of dopant onto said substrate crystal in overlapped relation to at least one of said crystal component gas and said compound gas of dopant, said reaction gas being introduced only for a certain time during one cycle;

evacuating respectively said at least one crystal component gas and reaction gas and said compound gas of dopant and reaction gas.

16. A method according to claim 15, wherein said reaction gas is partially overlapped with a least one of said crystal component gases and said compound gas of dopant.

17. A method according to claim 15, wherein said reaction gas is completely overlapped with at least one of said crystal component gases and said compound gas of dopant.

18. A method according to claim 15, wherein said reaction gas is $H_2$.

19. A method according to claim 15, wherein said reaction gas is one of said crystal component gases which are different in type from the crystal component gases directed onto said substrate.

20. A method according to claim 15, wherein said reaction gas is a compound gas of dopant which is different in type from the compound gas of dopant directed onto said substrate crystal.

21. A method according to claim 15, wherein said Group III–V compound crystal is one of GaAs, $Al_x Ga_{1-x}As$, GaP, InP, AlAs, InAs, InSb, $In_x Ga_{1-x}As$, $Al_x Ga_{1-x}P$, $InAs_x P_{1-x}$, and said crystal component gases are gases containing Al, Ga and In of the Group III and P, As and Sb of Group V.

22. A method according to claim 15, wherein said compound gas of dopant is selected from the group consisting of compound gases of Si, Ge, S, Se, Te, Zn, Cd and Mg.

* * * * *